US008785310B2

(12) United States Patent
Hasegawa et al.

(10) Patent No.: US 8,785,310 B2
(45) Date of Patent: Jul. 22, 2014

(54) METHOD OF FORMING CONFORMAL METAL SILICIDE FILMS

(75) Inventors: Toshio Hasegawa, Delmar, NY (US); Kunihiro Tada, Tokyo (JP); Hideaki Yamasaki, Tokyo (JP); David L. O'Meara, Albany, NY (US); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/427,343

(22) Filed: Mar. 22, 2012

(65) Prior Publication Data

US 2013/0196505 A1    Aug. 1, 2013

Related U.S. Application Data

(60) Provisional application No. 61/591,843, filed on Jan. 27, 2012.

(51) Int. Cl.
    H01L 21/44    (2006.01)
(52) U.S. Cl.
    USPC ........... 438/581; 438/583; 438/630; 438/651; 438/664; 438/682
(58) Field of Classification Search
    USPC .................. 438/664, 581, 583, 630, 651, 682
    See application file for complete search history.

(56) References Cited

U.S. PATENT DOCUMENTS

| 6,908,849 | B2 | 6/2005 | Derraa et al. |
| 7,094,685 | B2 | 8/2006 | Yang et al. |
| 7,144,806 | B1 | 12/2006 | Fair et al. |
| 7,981,794 | B2 | 7/2011 | Narushima et al. |
| 2003/0123216 | A1 | 7/2003 | Yoon et al. |
| 2004/0166622 | A1 | 8/2004 | Sandhu et al. |
| 2005/0233093 | A1 | 10/2005 | Tada et al. |
| 2006/0105515 | A1* | 5/2006 | Amos et al. ................... 438/199 |
| 2007/0004186 | A1 | 1/2007 | Yoshii et al. |
| 2007/0202254 | A1 | 8/2007 | Ganguli et al. |
| 2009/0071404 | A1 | 3/2009 | Tada et al. |
| 2009/0146306 | A1 | 6/2009 | Lee et al. |
| 2009/0212330 | A1 | 8/2009 | Bernard et al. |

OTHER PUBLICATIONS

United States Patent and Trademark Office, International Search Report and Written Opinion for corresponding International application No. PCT/US2013/023303, mailed Apr. 2, 2013, 16 pages.

* cited by examiner

*Primary Examiner* — Long K Tran

(57) ABSTRACT

A method is provided for forming a metal silicide layer on a substrate. According to one embodiment the method includes providing the substrate in a process chamber, exposing the substrate at a first substrate temperature to a plasma generated from a deposition gas containing a metal precursor, where the plasma exposure forms a conformal metal-containing layer on the substrate in a self-limiting process. The method further includes exposing the metal-containing layer at a second substrate temperature to a reducing gas in the absence of a plasma, where the exposing steps are alternatively performed at least once to form the metal silicide layer, and the deposition gas does not contain the reducing gas. The method provides conformal metal silicide formation in deep trenches with high aspect ratios.

22 Claims, 10 Drawing Sheets

METHOD OF FORMING CONFORMAL METAL SILICIDE FILMS

CROSS-REFERENCE TO RELATED APPLICATIONS

This application is related to and claims priority to U.S. Provisional application Ser. No. 61/591,843 (Ref no. TTCA-389Pro) filed on Jan. 27, 2012, the entire contents of which are herein incorporated by reference.

FIELD OF THE INVENTION

The present invention generally relates to forming conformal metal silicide films on a substrate using vapor deposition. The substrate may include deep trenches with high aspect ratios used in semiconductor devices.

BACKGROUND OF THE INVENTION

In the semiconductor industry, the minimum feature sizes of microelectronic devices are approaching the deep sub-micron regime to meet the demand for faster, lower power microprocessors and digital circuits. Low resistivity refractory metal silicide layers, for instance, are widely used as part of the gate stack in dynamic random access memory (DRAM) and enhanced DRAM (EDRAM) manufacturing. Another application for low resistivity metal silicide layers is in the capacitor of deep trench-DRAM or in vias of stacked DRAM cells. Both applications suffer from the fact that the serial resistance of the inner electrode (plug, deep trench-DRAM) or vias (stacked DRAM) increases with the square of the inverse ground rule. This effect is further enhanced since the requirement of constant capacitance leads to deeper trenches (or higher stacks, respectively) in advanced DRAMs.

A key requirement for deep trench-DRAM is good step coverage of metal silicide films and layers in trenches with high aspect ratios. Additional requirements include that the metal silicide films must have low electrical resistivity and must be stable at conventional processing temperatures used in manufacturing integrated circuits. Conformal deposition of these films is usually required and this is very challenging for very deep trenches.

SUMMARY OF THE INVENTION

Embodiments of the invention describe methods for forming conformal metal silicide layers on a substrate, for example in deep trenches formed in the substrate. The metal silicide layer can, for example, contain a titanium silicide, a molybdenum silicide, a tungsten silicide, a tantalum silicide, or a vanadium silicide, or a combination of two or more thereof.

According to one embodiment, the method includes a) providing the substrate in a process chamber, b) exposing the substrate at a first substrate temperature to a plasma generated from a deposition gas containing a metal precursor, wherein the plasma exposure deposits a conformal metal-containing layer on the substrate in a self-limiting process, and c) exposing the metal-containing layer at a second substrate temperature to a reducing gas in the absence of a plasma, where b) and c) are alternatively performed at least once to form the metal silicide layer, and the deposition gas does not contain the reducing gas.

According to another embodiment, the method includes a) providing the substrate in a process chamber, and b) exposing the substrate at a first substrate temperature to a plasma generated from a deposition gas containing a metal precursor, where the plasma exposure forms a conformal metal-containing layer on the substrate in a self-limiting process. The method further includes c) exposing the substrate at a second substrate temperature to a reducing gas in the absence of a plasma, where b) and c) are alternatively performed at least once to form a metal film on the substrate, and where the deposition gas does not contain the reducing gas, and d) annealing the substrate at a third substrate temperature to form the metal silicide film, where the third substrate temperature is greater than the second substrate temperature. The method can further include, in d), depositing silicon on the metal film prior to the annealing.

According to yet another embodiment, the method includes a) providing a substrate in a process chamber, and b) thermally exposing the substrate at a first substrate temperature to a deposition gas containing a metal precursor in the absence of a plasma, where the thermal exposure forms a conformal metal-containing layer on the substrate in a self-limiting process. The method further includes c) modifying the metal-containing layer by exposure to a plasma containing a noble gas, and d) exposing the modified metal-containing layer at a second substrate temperature to a reducing gas in the absence of a plasma, where the b)-d) are sequentially and alternatively performed at least once to form the metal silicide film.

DETAILED DESCRIPTION OF SEVERAL EMBODIMENTS

Figure 1:
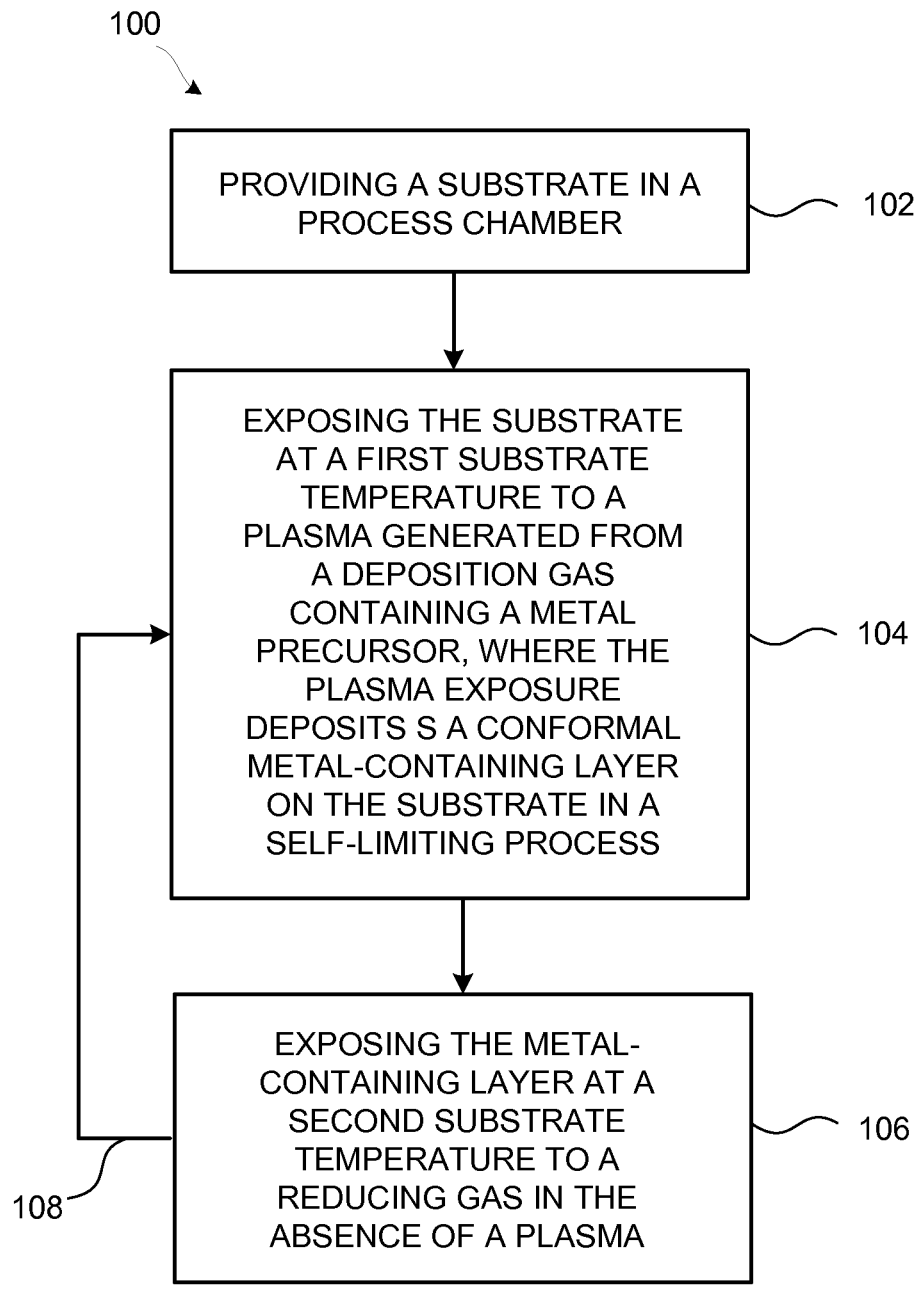
FIG. 1 is a flow diagram of a method for forming a metal silicide film on a substrate according to an embodiment of the invention.

Methods for forming conformal metal silicide layers on substrates are disclosed in several embodiments. The metal silicide layers can, for example, include a titanium silicide (e.g., $TiSi_x$), a molybdenum silicide (e.g., $MoSi_x$), a tungsten silicide ($WSi_x$), a tantalum silicide (e.g., $TaSi_x$), or a vanadium silicide ($VSi_x$), or a combination of two or more thereof.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. In this detailed description, like parts are designated by like reference numbers throughout the several drawings.

FIG. 1 is a flow diagram 100 for a method of forming a metal silicide film on a substrate according to an embodiment of the invention. The method includes, in 102, providing a substrate in a process chamber. In some embodiments, the substrate may be a patterned substrate containing etched features formed therein. The etched features can, for example, include trenches, vias, or a combination thereof, that are commonly found in semiconductor devices. However, embodiments of the invention may also be successfully applied to unpatterned planar substrates.

Figure 2A:
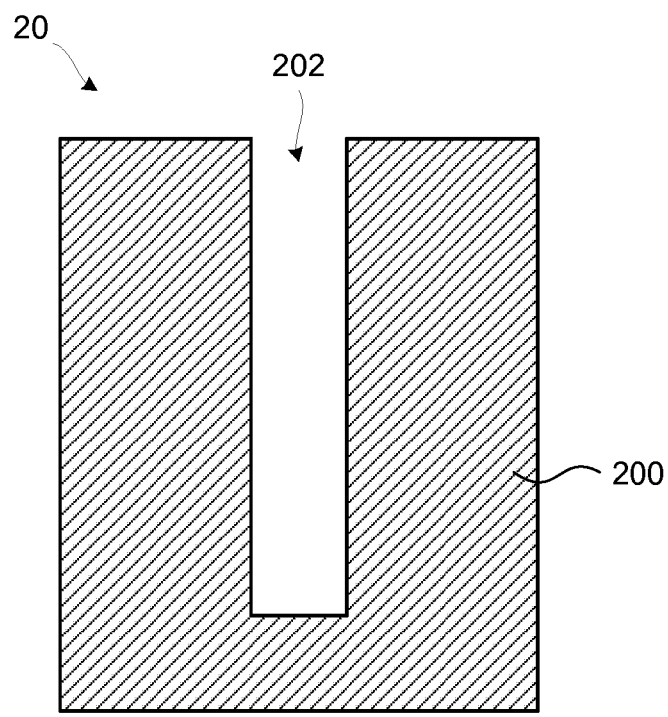
FIGS. 2A-2C show schematic cross-sectional views of a process flow for forming a metal silicide film on a substrate according to an embodiment of the invention.
Figure 2B:
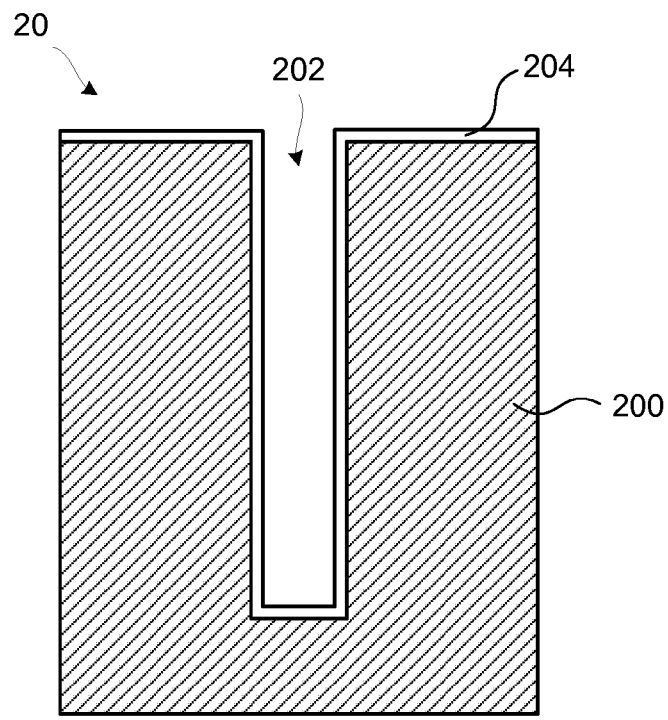
Figure 2C:
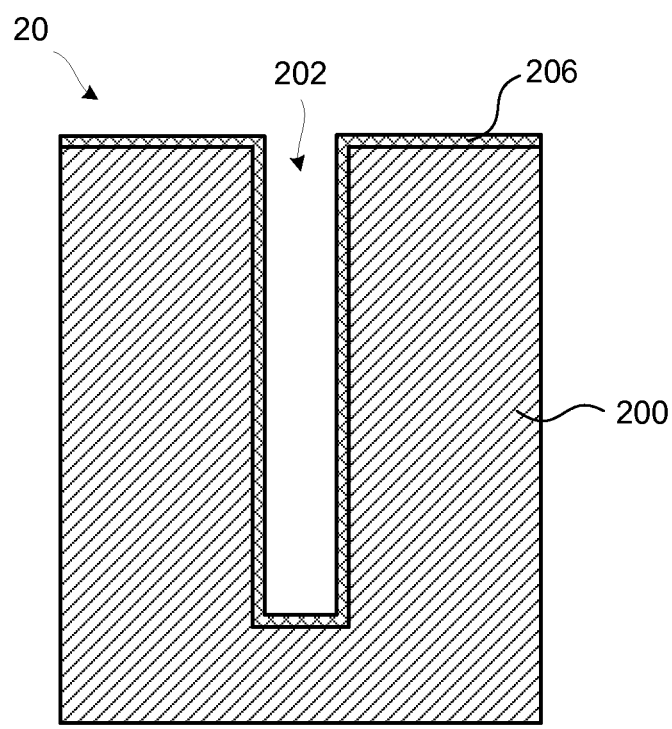

Referring also to FIGS. 2A-2C, FIG. 2A shows a schematic cross-sectional view of a patterned substrate 20 according to one embodiment of the invention. The substrate material 200 may contain bulk silicon, a single crystal silicon (doped or undoped), SiC, SiGe, SiGeC, or any combinations thereof. According to one embodiment, the substrate material 200 may contain $Si_xGe_{1-x}$ compounds, where x is the atomic fraction of Si, 1−x is the atomic fraction of Ge, and 0<1−x<1. In one example, the substrate material 200 can contain a tensile-strained $Si_xGe_{1-x}$ (x>0.5) deposited on a relaxed $Si_{0.5}Ge_{0.5}$ buffer layer. The patterned substrate 20 may be of any size, for example a 200 mm substrate, a 300 mm substrate, a 450 mm substrate, or an even larger substrate. In one example, the patterned substrate 20 can include a tensile-strained Si layer.

In the embodiment depicted in FIG. 2A, the patterned substrate 20 contains a trench 202 formed in the substrate material 200. The trench 202 can, for example, have an aspect ratio (depth/width) greater than or equal to about 2:1, for example 3:1, 5:1, 10:1, 15:1, 20:1, 30:1, 40:1, 50:1, 60:1, 70:1, or greater than 70:1. In some embodiments, the trench 202 can have an aspect ratio between about 20:1 and about 40:1, between about 40:1 and about 60:1, between about 60:1 and about 80:1, or between about 80:1 and about 100:1. The trench 202 can have a width (opening) of about 200 nm (nanometers) or less, for example 150 nm, 100 nm, 65 nm, 32 nm, 22 nm, or less. In some embodiments, the trench 202 can have a width between about 200 nm and about 100 nm, between about 100 nm and about 80 nm, between about 80 nm and about 60 nm, between about 60 nm and about 40 nm, or between about 40 nm and about 20 nm. The trench 202 can have a depth between about 20 nm and about 5000 nm, for example between about 20 nm and about 100 nm, between about 100 nm and about 500 nm, between about 500 nm and about 1000 nm, or between about 1000 nm and about 5000 nm. However, embodiments of the invention are not limited to these aspect ratios, trench widths, and trench depths, as other aspect ratios, trench widths, and trench depths may be utilized. For example, the trench 202 can be formed using a photolithographic process and dry etching techniques that are well known to persons skilled in the art.

Still referring to FIG. 2A, in one example, the trench 202 can be a deep trench with a width between about 50 nm and 100 nm, a depth between about 2000 nm and 5000 nm, and an aspect ratio between about 40:1 and about 100:1. The substrate material 200 can, for example, include Si (e.g., single crystal Si, poly Si, or amorphous Si) or a Si-containing material.

In 104, the substrate is exposed at a first substrate temperature to a plasma generated from a deposition gas containing a metal-containing precursor for forming a metal silicide film. The metal-containing precursor can include titanium (Ti), molybdenum (Mo), tungsten (W), tantalum (Ta), or vanadium (V), or a combination of two or more thereof However, some embodiments of the invention are not limited to those metal elements and other metal elements may be selected from the Periodic Table of the Elements. The metal precursor can include a metal halide (e.g., a titanium halide, a molybdenum halide, a tungsten halide, a tantalum halide, a vanadium halide, or a combination of two or more thereof). The titanium halide can include $TiF_4$, $TiCl_4$, $TiBr_4$, or $TiI_4$. The molybdenum halide can include $MoCl_4$. The tungsten halide can include $WCl_6$ or $WF_6$. The tantalum halide can include $TaF_5$, $TaBr_5$, $TaCl_5$, or $TaI_5$. The vanadium halide can include $VCl_4$. Other metal halides with the metal atom in other oxidation states may also be used. In some examples, the deposition gas may consist of a metal precursor gas and an inert gas (e.g., a noble gas). Non-limiting examples include $TiCl_4$ and argon (Ar), $TaCl_5$ and Ar, or $WCl_6$ and Ar.

The plasma exposure in 104 deposits a conformal metal-containing layer 204 over the topography of the patterned substrate 20 in a self-limiting process, including on the sidewall and bottom of the trench 202. This is schematically shown in FIG. 2B. A thickness of the conformal metal-containing layer 204 may be on the order of about one monolayer, or less. The plasma exposure is self-limiting and deposition of the metal-containing layer 204 stops once the exposed surfaces of the patterned substrate 20 are saturated with the material of the metal-containing layer 204.

According to embodiments of the invention, the plasma in 104 does not contain a hydrogen-containing reducing gas (e.g., $H_2$). The inventors have realized that the absence of a hydrogen-containing reducing gas in the plasma in 104 enables the self-limiting conformal deposition over the topography of the patterned substrate 20. When the deposition gas contains $TiCl_4$ gas, $TiCl_2$ molecular species are formed in the plasma, and it is contemplated that the conformal metal-containing layer 204 can contain approximately one monolayer of adsorbed $TiCl_2$ molecular species on the surfaces of the patterned substrate 20. Even though plasma exposures are usually directional (anisotropic), the $TiCl_2$ molecular species formed in the plasma are thought to migrate over the topography of the patterned substrate 20 until all the $TiCl_2$ adsorption sites are occupied. Thus, the plasma exposure in 104 results in conformal deposition of the metal-containing layer 204, and the film forming process described in embodiments of the invention provides a much needed conformal deposition of hard-to-deposit metal-containing layers in simple and complex deep features etched in a substrate.

For comparison, if the deposition gas further contained $H_2$, the metal-containing layer 204 would be non-conformally deposited as a Ti metal layer over the topography of the patterned substrate 20 in a non-self-limiting process, due to the reducing effects of the plasma excited $H_2$. The non-conformal metal-containing layer would be thickest on the horizontal field surface of the patterned substrate 20 with little deposition on the sidewall of the trench 202, especially near the bottom of the trench 202.

The plasma processing conditions may be selected to efficiently form the conformal metal-containing layer 204 over the topography of the patterned substrate 20. For example, the first substrate temperature may be between about 25° C. and about 650° C., for example between about 25° C. and about 200° C., between about 200° C. and about 450° C., or between about 450° C. and about 700° C. According to one embodiment, the first substrate temperature may be about 450° C., or less. According to another embodiment, the first substrate temperature may be between about 450° C. and about 650° C. A gas pressure in process chamber during the plasma exposure can be between about 0.1 Torr and about 5 Torr, and the plasma exposure time can be between about 1 second and 10 seconds. However, other gas pressures and plasma exposure times may be used.

Following the plasma exposure in 104, the process chamber may be purged with Ar or nitrogen ($N_2$) to remove the deposition gas and any reaction byproducts from the process chamber.

Thereafter, in 106, the conformal metal-containing layer 204 (e.g., a layer of adsorbed $TiCl_2$) is exposed at a second substrate temperature to a reducing gas in the absence of a plasma. The inventors have realized that adsorbed $TiCl_2$ can be reduced to Ti metal by a thermal exposure to a reducing gas in the absence of a plasma, in contrast to adsorbed $TiCl_4$ which requires an exposure to a plasma excited reducing gas. The process of reacting Ti metal with Si creates a conformal $TiSi_x$ layer without the need of continuously depositing Ti in an atomic layer deposition (ALD) process, which has not been reported so far.

The reducing gas can contain a hydrogen-containing gas (e.g., $H_2$), a silicon-hydrogen-containing gas (e.g., $SiH_4$), a boron-hydrogen-containing gas (e.g., $B_2H_6$), or a combination thereof The reducing gas may further include an inert gas such as a noble gas. The inventors have realized that the isotropic exposure of the conformal metal-containing layer 204 to the reducing gas chemically reduces the conformal metal-containing layer 204 to the corresponding metal (e.g., Ti metal) that subsequently can react with Si of the substrate material 200 to form a conformal metal silicide layer 206 depicted in FIG. 2C. The metal silicide layer 206 can contain a titanium silicide (e.g., $TiSi_x$), a molybdenum silicide (e.g., $MoSi_x$), a tungsten silicide ($WSi_x$), a tantalum silicide (e.g., $TaSi_x$), or a vanadium silicide ($VSi_x$), or a combination of two or more thereof.

According to one embodiment, the second substrate temperature is high enough for the reduced metal to efficiently react with the substrate material and form the metal silicide layer 206.

The processing conditions in 106 may be selected to efficiently reduce the conformal metal-containing layer 204 and form the conformal metal silicide layer 206. For example, the second substrate temperature may between about 200° C. and about 700° C., for example between about 200° C. and about 450° C., or between about 450° C. and about 700° C. According to one embodiment, the second substrate temperature may be between about 450° C. and about 650° C. A gas pressure in process chamber during the exposure to the reducing gas can be between about 0.1 Torr and about 5 Torr, and the exposure time can be between about 1 second and 10 seconds. However, other gas pressures and exposure times may be used.

In one example, the first and second substrate temperatures may be the same or approximately the same. In another example, the first and second substrate temperatures may be different. According to one embodiment, the first substrate temperature may be less than about 450° C., and the second substrate temperature may be between about 450° C. and about 650° C. According to one embodiment, both the first and second substrate temperatures may be between about 450° C. and about 650° C.

Following the exposure to the reducing gas in 106, the process chamber may be purged with Ar or nitrogen ($N_2$) to remove the reducing gas and any reaction byproducts from the process chamber.

The processing steps 104 and 106 may be repeated at least once as schematically shown by process arrow 108 to increase the thickness and the conductivity of the conformal metal silicide layer 206. When the metal silicide layer 206 has a desired thickness, the patterned substrate 20 may be further processed to manufacture a semiconductor device. A thickness of the conformal metal silicide layer 206 can, for example, between about 0.5 nm and about 5 nm.

Figure 3:
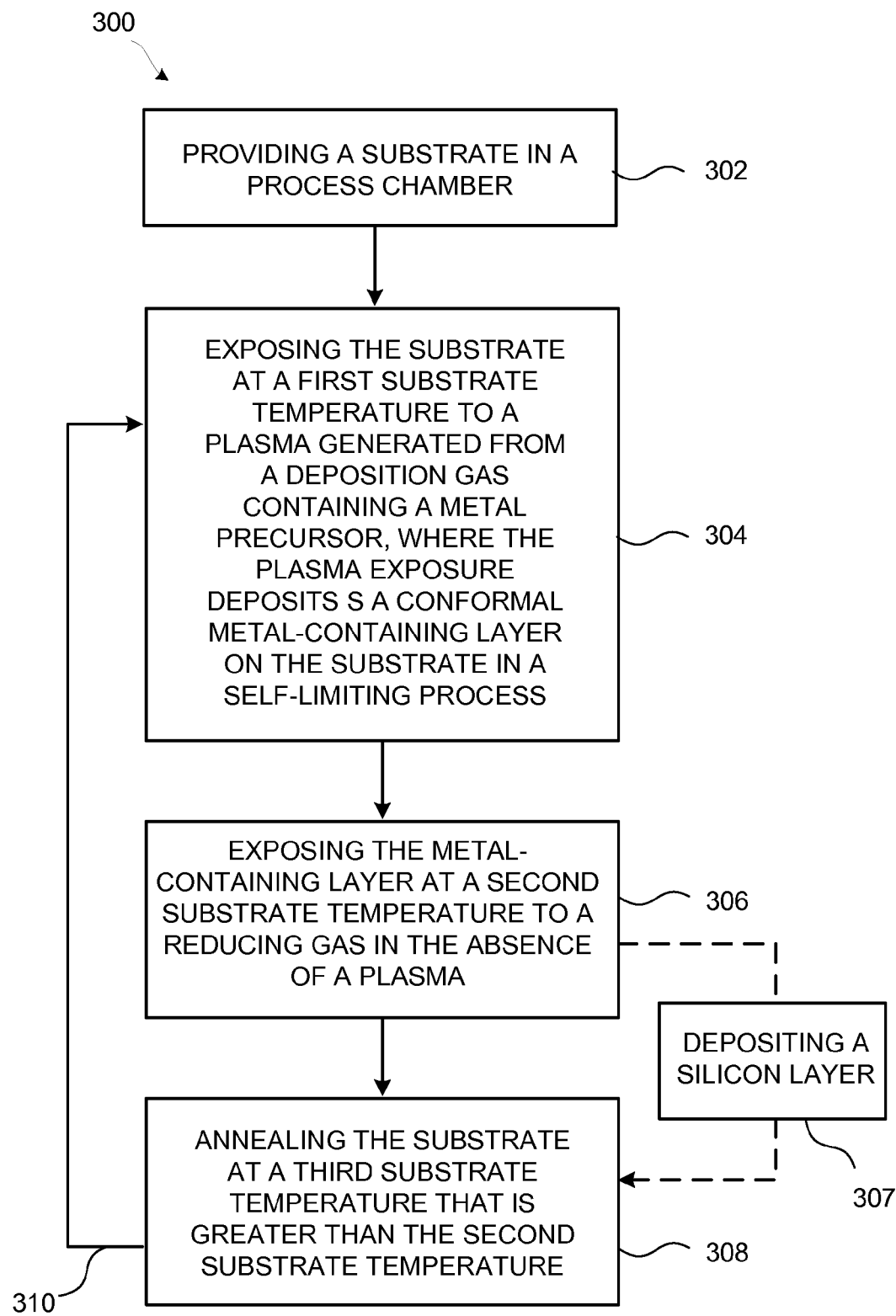
FIG. 3 is a flow diagram of a method for forming a metal silicide film on a substrate according to another embodiments of the invention.
Figure 4A:
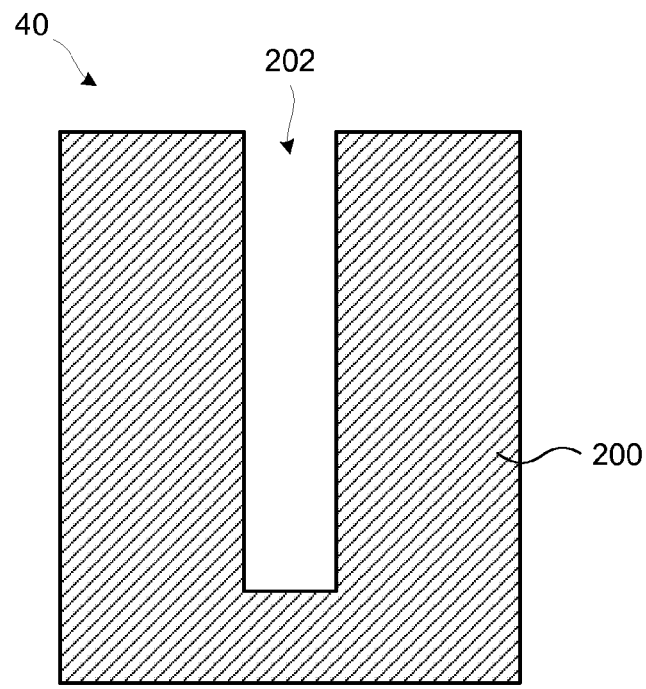
FIGS. 4A-4D show schematic cross-sectional views of a process flow for forming a metal silicide film on a substrate according to another embodiment of the invention.

FIG. 3 is a flow diagram 300 of a method for forming a metal silicide film on a substrate, and FIGS. 4A-4D and FIG. 5A-5B show schematic cross-sectional views of process flows for forming a metal silicide film on a substrate according to embodiments of the invention. The method includes, in 302, providing a substrate in a process chamber. FIG. 4A shows a schematic cross-sectional view of a patterned substrate 40 according to one embodiment of the invention. The patterned substrate 40 contains a trench 202 formed in substrate material 200. Examples of the substrate material 200 and the trench 202 have been described above.

In 304, the patterned substrate 40 is exposed at a first substrate temperature to a plasma generated from a deposition gas containing a metal-containing precursor for forming a metal silicide film. The metal-containing precursor can include Ti, Mo, W, Ta, or V, or a combination of two or more thereof. However, some embodiments of the invention are not limited to those metal elements and other metal elements may be selected from the Periodic Table of the Elements. The metal precursor can include a metal halide (e.g., a titanium halide, a molybdenum halide, a tungsten halide, a tantalum halide, or a vanadium halide, or a combination of two or more thereof). In some examples, the deposition gas may consist of a metal precursor gas and an inert gas (e.g., a noble gas). Non-limiting examples include $TiCl_4$ and argon (Ar), $TaCl_5$ and Ar, or $WCl_6$ and Ar.

Figure 4B:
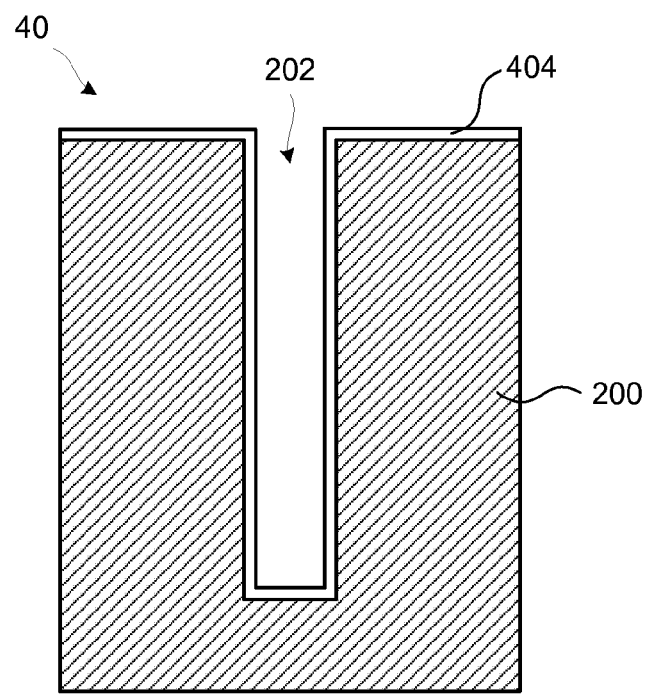
Figure 4C:
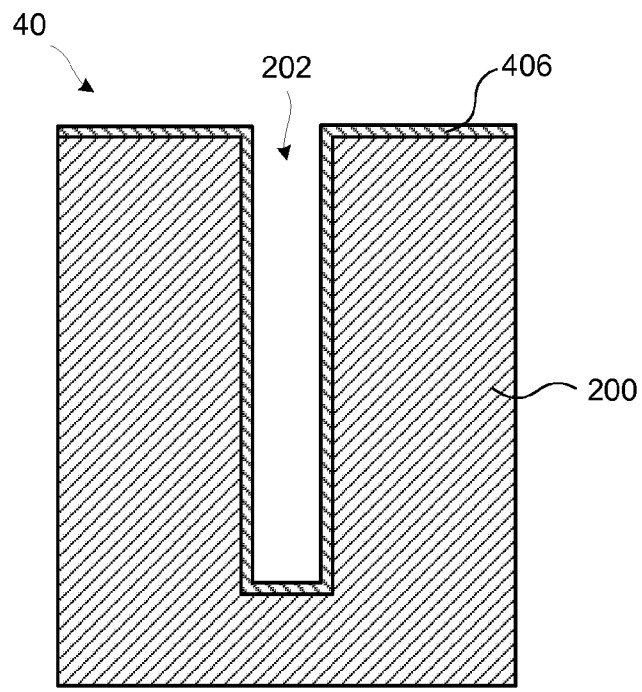

The plasma exposure in 304 deposits a conformal metal-containing layer 404 over the topography of the patterned substrate 40 in a self-limiting process, including on the sidewall and bottom of the trench 202. This is schematically shown in FIG. 4B. A thickness of the conformal metal-containing layer 404 can be on the order of about one monolayer, or less. The plasma exposure is self-limiting and deposition of the metal-containing layer 404 stops once the exposed surfaces of the patterned substrate 40 are saturated with the material of the metal-containing layer 404. According to embodiments of the invention, the plasma exposure in 404 does not contain a hydrogen-containing reducing gas (e.g., $H_2$).

The plasma processing conditions may be selected to efficiently form the conformal metal-containing layer 404 over the topography of the patterned substrate 40 in a self-limiting process. For example, the first substrate temperature may be between about 25° C. and about 650° C., for example between about 25° C. and about 200° C., between about 200° C. and about 450° C., or between about 450° C. and about 700° C. According to one embodiment, the first substrate temperature may be about 450° C., or less. According to another embodiment, the first substrate temperature may be between about 450° C. and about 650° C. A gas pressure in process chamber during the plasma exposure can be between about 0.1 Torr and about 5 Torr, and the plasma exposure time can be between about 1 second and 10 seconds. However, other gas pressures and plasma exposure times may be used.

Following the plasma exposure in 304, the process chamber may be purged with Ar or nitrogen ($N_2$) to remove the deposition gas and any reaction byproducts from the process chamber.

Thereafter, in 306, the conformal metal-containing layer 404 (e.g., a layer of adsorbed $TiCl_2$) is exposed at a second substrate temperature to a reducing gas in the absence of a plasma. The reducing gas can contain a hydrogen-containing gas (e.g., $H_2$), a silicon-hydrogen-containing gas (e.g., $SiH_4$), a boron-hydrogen-containing gas (e.g., $B_2H_6$), or a combination thereof. The reducing gas may further include an inert gas such as a noble gas. The exposure of the conformal metal-containing layer 404 to the reducing gas chemically reduces the conformal metal-containing layer 404 to a conformal metal layer 406 containing the corresponding metal (e.g., Ti metal). According to one embodiment, the second temperature is not high enough for the reduced metal to efficiently react with the substrate material and form a metal silicide.

The processing conditions in 306 may be selected to efficiently reduce the conformal metal-containing layer 404 to the corresponding conformal metal layer 406, without reacting the metal layer with silicon from the substrate material 200. For example, the second substrate temperature may between about 200° C. and about 450° C., or less than about 450° C. A gas pressure in process chamber during the exposure to the reducing gas can be between about 0.1 Torr and about 5 Torr, and the exposure time can be between about 1 second and 10 seconds. However, other gas pressures and exposure times may be used.

In one example, the first and second substrate temperatures may be the same or approximately the same. In another example, the first and second substrate temperatures may be different. According to one embodiment, the first substrate temperature may be higher than the second substrate temperature. According to one embodiment, both the first and second substrate temperatures may be less than about 450° C.

Since the plasma exposure in 306 (e.g., saturating substrate exposure of $TiCl_2$ formed in the plasma) and the exposure to the reducing gas in 308 ($H_2$) are both isotropic exposure processes, the resulting metal layer 406 is conformally formed over the topography of the patterned substrate 40, including on the sidewall and on the bottom of the trench 202.

Following the exposure to the reducing gas in 306, the process chamber may be purged with Ar or nitrogen ($N_2$) to remove the reducing gas and any reaction byproducts from the process chamber.

Figure 4D:
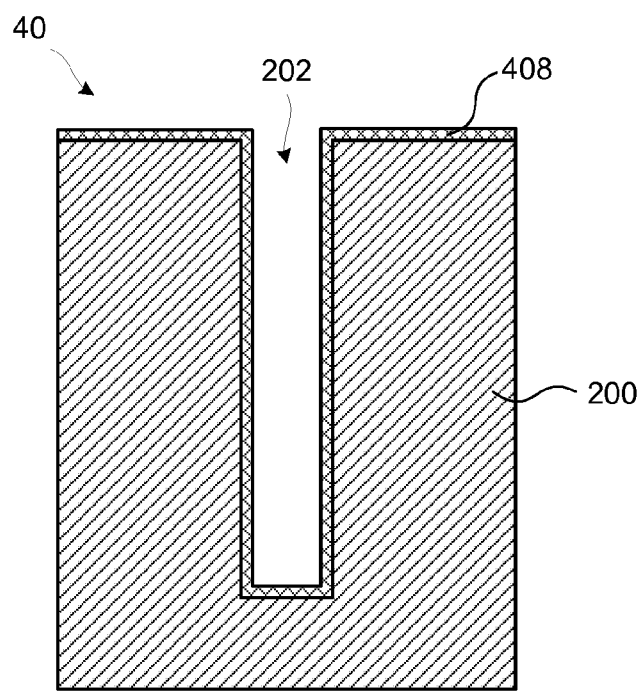

In 308, the substrate is annealed at a third substrate temperature that is greater than the second substrate temperature. The processing conditions in 308 may be selected to efficiently react the metal layer 406 with the substrate material 200 and form a conformal metal silicide layer 408 that is schematically shown in FIG. 4D. For example, the second substrate temperature may be between about 450° C. and about 700° C. According to one embodiment, the second substrate temperature may be between about 450° C. and about 650° C. A gas pressure of an annealing gas (e.g., Ar or $N_2$) in process chamber during the anneal can be between about 0.1 Torr and about 5 Torr, and the anneal time can be between about 1 second and 500 seconds. However, other gas pressures and anneal times may be used.

The processing steps 304-308 may be repeated at least once as schematically shown by process arrow 310 to increase the thickness and the conductivity of the conformal metal silicide layer 408. A thickness of the conformal metal silicide layer 408 can, for example, between about 0.5 nm and about 5 nm.

Figure 5A:
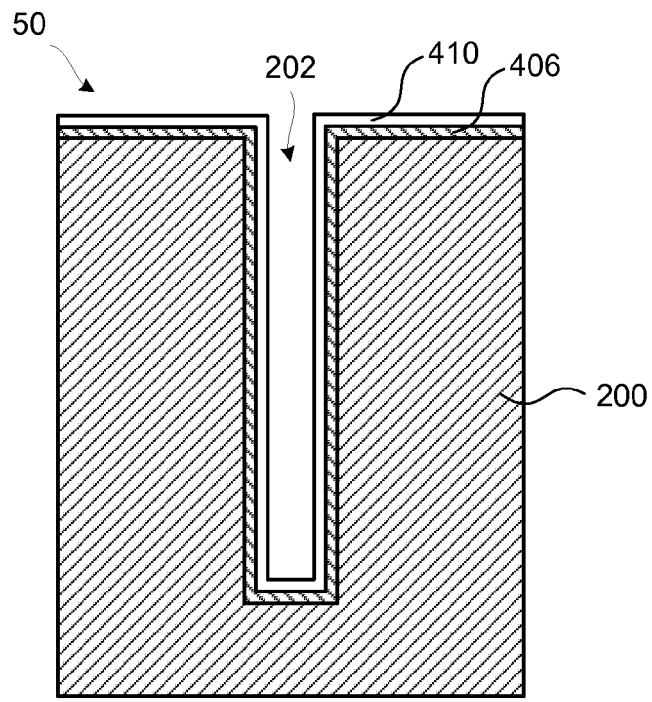
FIGS. 5A-5B show schematic cross-sectional views of a process flow for forming a metal silicide film on a substrate according to yet another embodiment of the invention.

According to one embodiment, the process flow 300 further includes, in 307, depositing a silicon layer 410 on the conformal metal layer 406. This is schematically shown in FIG. 5A. The silicon layer 410 can reduce or avoid consumption of silicon from the substrate material 200 and add metal silicide thickness for sidewall control. This enables the use of thicker or other metal silicide materials. The silicon layer 410 may be deposited using any conventional deposition method, for example chemical vapor deposition (CVD), plasma-enhanced CVD (PECVD), ALD, or plasma-enhanced ALD (PEALD). The silicon layer 410 may be conformally deposited over the topography of the patterned substrate 50. A thickness of the silicon layer 410 can be between about 0.5 nm and about 10 nm, or greater. For example, the thickness of the silicon layer 410 can be between about 0.5 nm and about 1 nm, between about 1 nm and about 3 nm, between about 3 nm and about 5 nm, or between about 5 nm and about 10 nm.

Figure 5B:
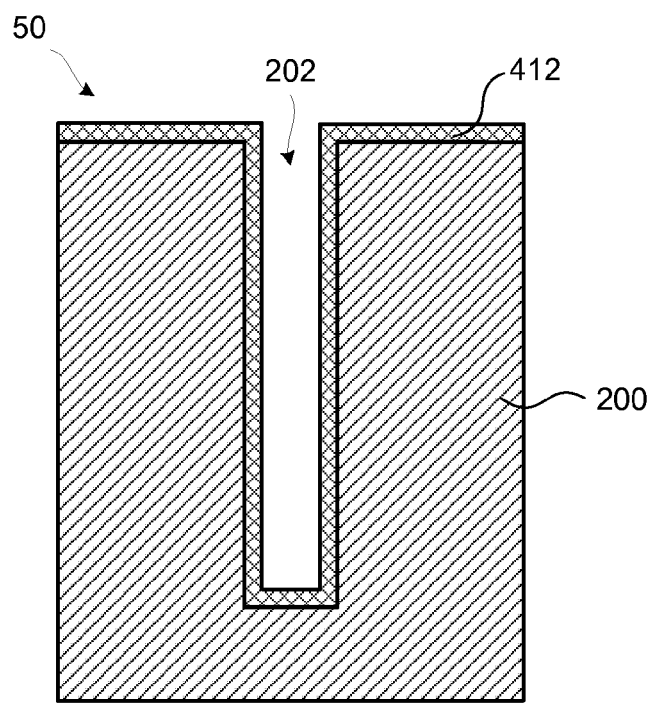

Following the silicon deposition in 307, the substrate may be annealed in 308 as described above. The processing conditions in 308 may be selected to efficiently react the metal layer 406 with silicon layer 410 and form a conformal metal silicide layer 412 that is schematically shown in FIG. 5B. The metal silicide layer 412 can contain a titanium silicide (e.g., $TiSi_x$), a molybdenum silicide (e.g., $MoSi_x$), a tungsten silicide ($WSi_x$), a tantalum silicide (e.g., $TaSi_x$), or a vanadium silicide ($VSi_x$), or a combination of two or more thereof. For example, the second substrate temperature may be between about 450° C. and about 700° C. According to one embodiment, the third substrate temperature (annealing temperature) may be between about 450° C. and about 650° C. A gas pressure of an annealing gas (e.g., Ar or $N_2$) in process chamber during the anneal can be between about 0.1 Torr and about 5 Torr, and the anneal time can be between about 1 second and 500 seconds. However, other gas pressures and anneal times may be used.

Figure 6:
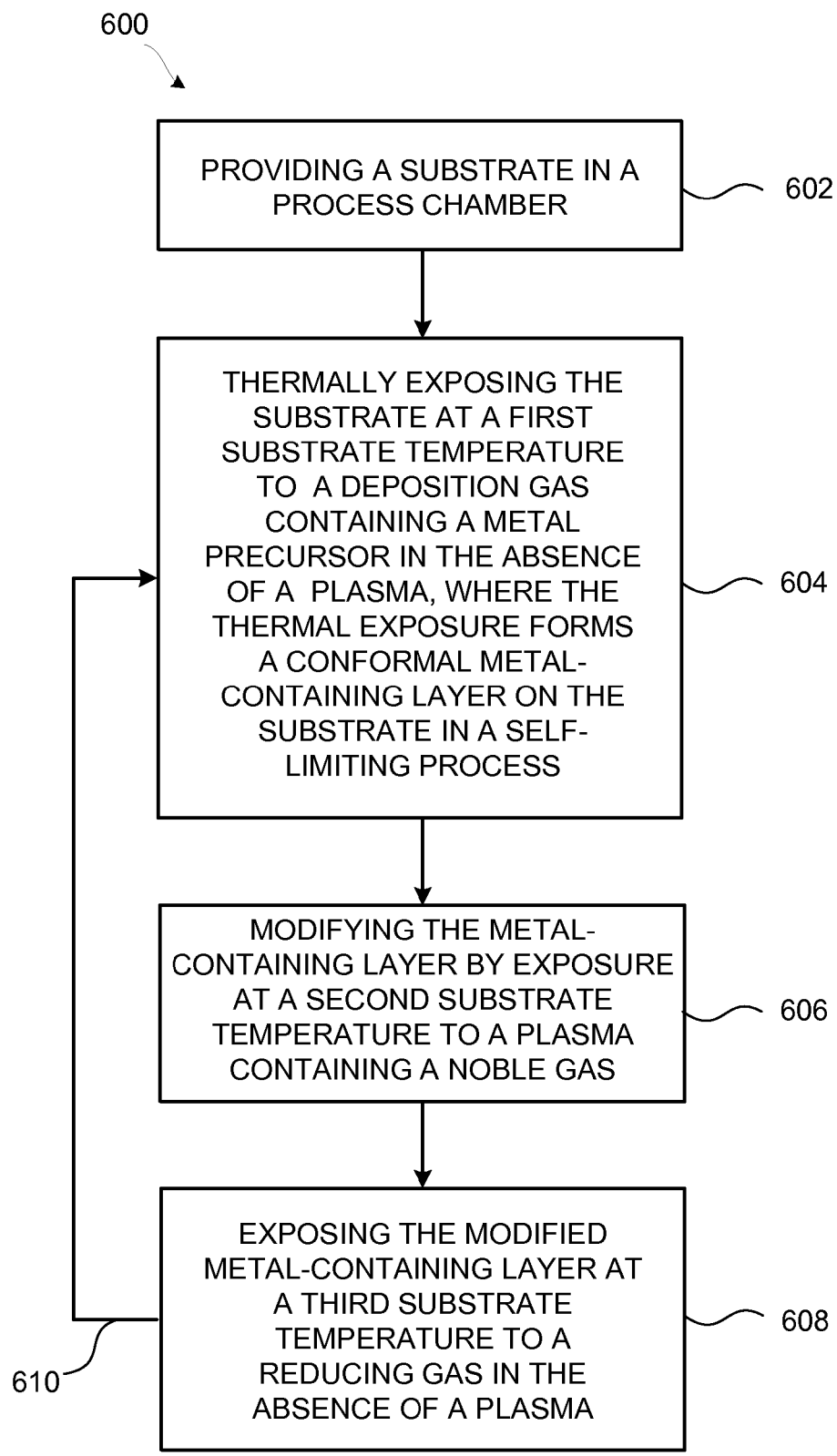
FIG. 6 is a flow diagram of a method for forming a metal silicide film on a substrate according to another embodiment of the invention.
Figure 7A:
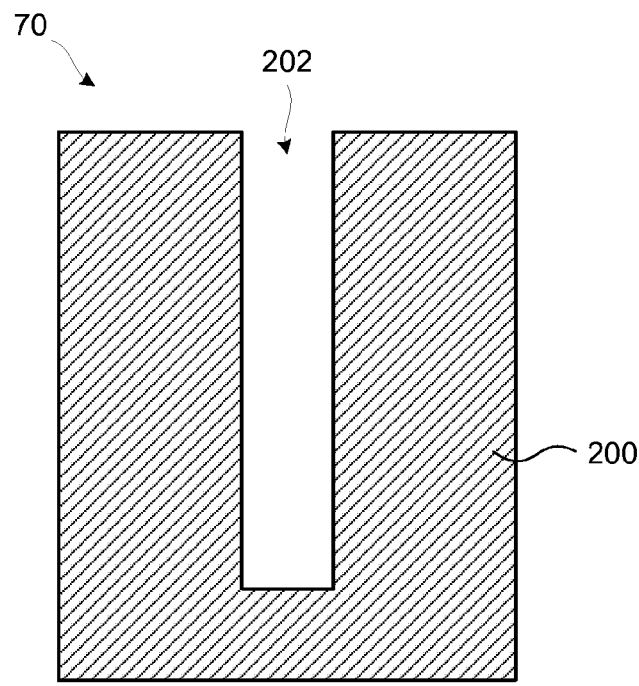
FIGS. 7A-7D show schematic cross-sectional views of a process flow for forming a metal silicide film on a substrate according to an embodiment of the invention.

FIG. 6 is a flow diagram 600 of a method for forming a metal silicide film on a substrate, and FIGS. 7A-7D show schematic cross-sectional views of a process flow for forming a metal silicide film on a substrate according to an embodiment of the invention. The method includes, in 602, providing a substrate in a process chamber. FIG. 7A shows a schematic cross-sectional view of a patterned substrate 70 according to one embodiment of the invention. The patterned substrate 70 contains a trench 202 formed in substrate material 200. Examples of the substrate material 200 and the trench 202 have been described above.

In 604, the patterned substrate 70 is thermally exposed at a first substrate temperature to a deposition gas containing a metal-containing precursor in the absence of a plasma. The metal-containing precursor can include Ti, Mo, W, Ta, or V, or a combination of two or more thereof However, some embodiments of the invention are not limited to those metal elements and other metal elements may be selected from the Periodic Table of the Elements. The metal precursor can include a metal halide (e.g., a titanium halide, a molybdenum halide, a tungsten halide, a tantalum halide, or a vanadium halide, or a combination of two or more thereof). In some examples, the deposition gas may consist of a metal precursor gas and an inert gas (e.g., a noble gas). Non-limiting examples include $TiCl_4$ and argon (Ar), $TaCl_5$ and Ar, or $WCl_6$ and Ar.

Figure 7B:
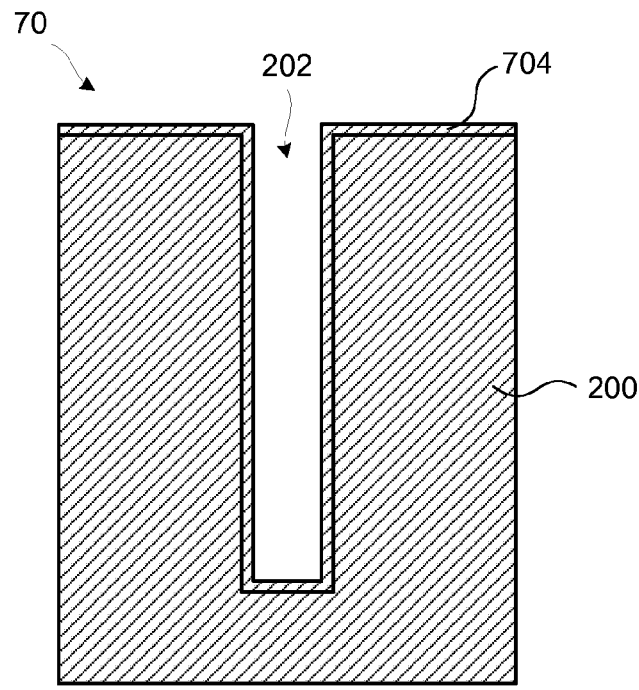

The thermal exposure of the patterned substrate 70 to the deposition gas forms a conformal metal-containing layer 704 over the topography of the patterned substrate 70 in a self-limiting process, including on the sidewall and bottom of the trench 202. This is schematically shown in FIG. 7B. A thickness of the conformal metal-containing layer 704 can be on the order of about one monolayer, or less. In one example, an exposure of $TiCl_4$ gas forms a layer adsorbed $TiCl_4$ on the substrate. For example, the first substrate temperature may be between about 25° C. and about 650° C., for example between about 25° C. and about 200° C., between about 200° C. and about 450° C., or between about 450° C. and about 700° C. According to one embodiment, the first substrate temperature may be about 450° C., or less. According to another embodiment, the first substrate temperature may be between about 450° C. and about 650° C. A gas pressure in process chamber during the gas exposure can be between about 0.1 Torr and about 5 Torr, and the gas exposure time can be between about 1 second and 10 seconds. However, other gas pressures and exposure times may be used.

Following the exposure in 604, the process chamber may be purged with Ar or nitrogen ($N_2$) to remove the deposition gas and any reaction byproducts from the process chamber.

Figure 7C:
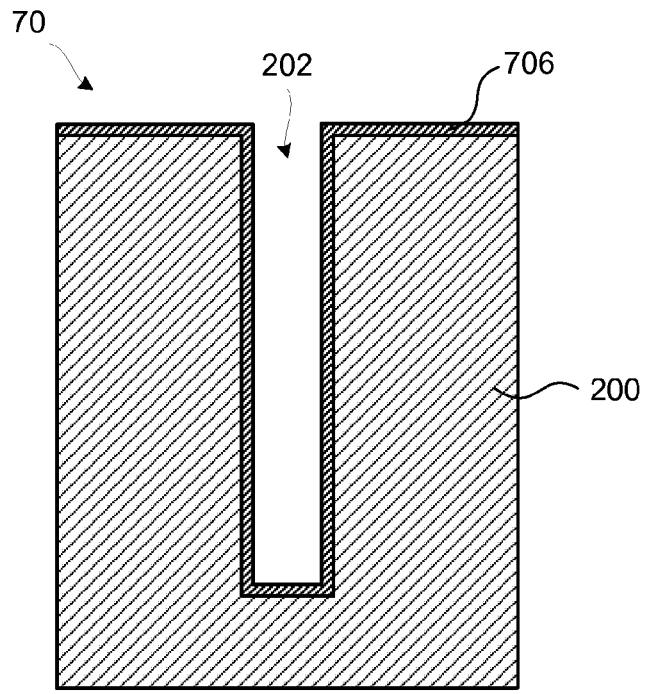
Figure 7D:
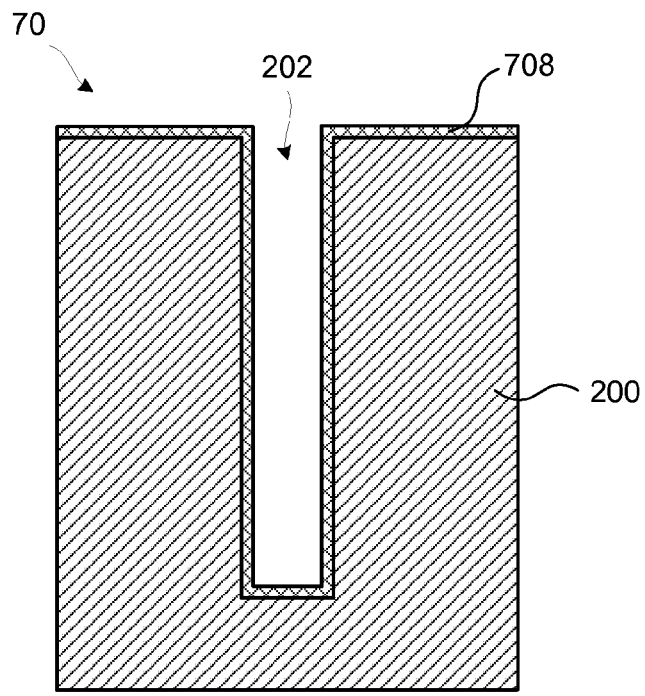

Thereafter, in 606, the substrate containing the conformal metal-containing layer 704 is exposed at a second substrate temperature to a plasma containing or consisting of a noble gas (e.g., Ar) to form a modified metal-containing layer 706. A modified metal-containing layer 706 is schematically shown in FIG. 7C. The plasma exposure in 606 partially dissociates the adsorbed species of the metal-containing layer 704. In one example, the plasma exposure dissociates adsorbed $TiCl_4$ and forms adsorbed $TiCl_x$ (x<4) species on the substrate.

For example, the plasma exposure in 606 may utilize a second substrate temperature between about 25° C. and about 650° C., for example between about 25° C. and about 200° C., between about 200° C. and about 450° C., or between about 450° C. and about 700° C. According to one embodiment, the second substrate temperature may be about 450° C., or less. According to another embodiment, the second substrate temperature may be between about 450° C. and about 650° C. A gas pressure in process chamber during the plasma exposure can be between about 0.1 Torr and about 5 Torr, and the plasma exposure time can be between about 10 second and 500 seconds. However, other gas pressures and plasma exposure times may be used.

Following the plasma exposure in 606, the process chamber may be purged with Ar or nitrogen ($N_2$) to remove any reaction byproducts from the process chamber.

Thereafter, in 608, the modified metal-containing layer 706 (e.g., a layer of adsorbed $TiCl_x$ (x<4)) is exposed at a third substrate temperature to a reducing gas in the absence of a plasma. The reducing gas can contain a hydrogen-containing gas (e.g., $H_2$), a silicon-hydrogen-containing gas (e.g., $SiH_4$), a boron-hydrogen-containing gas (e.g., $B_2H_6$), or a combination thereof. The reducing gas may further include an inert gas such as a noble gas. The exposure of the modified metal-containing layer 706 to the reducing gas chemically reduces the modified metal-containing layer 706 to the corresponding metal (e.g., Ti metal) that subsequently can react with Si of the substrate material 200 to form a conformal metal silicide layer 708 depicted in FIG. 7D. Thus, according to one embodiment, the third temperature is high enough for the reduced metal to efficiently react with the substrate material and form a metal silicide. According to another embodiment, an anneal at a fourth substrate temperature, that is higher than the third substrate temperature, may be need to react the metal with the substrate material and form a metal silicide. The metal silicide layer 708 can contain a titanium silicide (e.g., $TiSi_x$), a molybdenum silicide (e.g., $MoSi_x$), a tungsten silicide ($WSi_x$), a tantalum silicide (e.g., $TaSi_x$), or a vanadium silicide ($VSi_x$), or a combination of two or more thereof.

The processing conditions in 608 may be selected to efficiently reduce the conformal metal-containing layer 704 and form the conformal metal silicide layer 706. For example, the second substrate temperature may between about 200° C. and about 700° C., for example between about 200° C. and about 450° C., or between about 450° C. and about 700° C. According to one embodiment, the second substrate temperature may be between about 450° C. and about 650° C. A gas pressure in process chamber during the exposure to the reducing gas can be between about 0.1 Torr and about 5 Torr, and the exposure time can be between about 1 second and 10 seconds. However, other gas pressures and exposure times may be used.

In one example, the first, second, and third substrate temperatures may be the same or approximately the same. In another example, at least one of the first, second, and third substrates temperatures may be different. According to one embodiment, both the first substrate and the second temperature may be less than about 450° C., and the third substrate temperature can be between about 450° C. and about 650° C. According to one embodiment, both the first and the thirds substrate temperatures may be between about 450° C. and about 650° C.

Although the plasma exposure in 606 can be anisotropic, the thermal exposure to the deposition gas in 604 and the exposure to the reducing gas in 608 are both isotropic, and therefore the resulting metal layer 406 has a high degree of conformality over the topography of the patterned substrate 70. This allows for a substantially conformal formation of the metal silicide layer 708 over both simple and complex, deep features in a substrate.

Following the exposure to the reducing gas in 608, the process chamber may be purged with Ar or nitrogen ($N_2$) to remove the deposition gas and any reaction byproducts from the process chamber.

The processing steps 604-608 may be repeated at least once as schematically shown by process arrow 610 to increase the thickness and the conductivity of the conformal metal silicide layer 708. The thickness of the conformal metal silicide layer 708 can, for example, between about 0.5 nm and about 5 nm.

When step 604 is repeated, the metal silicide layer 708 is thermally exposed to a deposition gas containing a metal-containing precursor in the absence of a plasma. Using $TiCl_4$ as an example, although exposing a Ti metal layer to $TiCl_4$ etches the Ti metal layer, the inventors have realized that thermally exposing a titanium silicide layer to a deposition gas containing $TiCl_4$ in 604 does not etch the titanium silicide layer but allows formation of an adsorbed layer of $TiCl_2$ on the titanium silicide layer.

A plurality of embodiments for methods of forming conformal metal silicide layers have been described. The method provides a much needed conformal deposition of hard-to-deposit metal silicide layers in simple and complex deep features etched in a substrate. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate unless otherwise specified.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

The invention claimed is:

1. A method of forming a metal silicide layer on a substrate, comprising:
    a) providing the substrate in a process chamber;
    b) exposing the substrate at a first substrate temperature to a plasma generated from a deposition gas containing a metal precursor, wherein the plasma exposure forms a conformal metal-containing layer on the substrate in a self-limiting process; and
    c) exposing the metal-containing layer at a second substrate temperature to a reducing gas in the absence of a plasma, wherein b) and c) are alternatively performed at least once to form the metal silicide layer, and wherein the deposition gas does not contain the reducing gas.

2. The method of claim 1, wherein the metal-precursor contains a titanium halide, a molybdenum halide, a tungsten halide, a tantalum halide, or a vanadium halide, or a combination of two or more thereof.

3. The method of claim 1, wherein the metal silicide layer comprises titanium silicide, molybdenum silicide, tungsten silicide, tantalum silicide, or vanadium silicide, or a combination of two or more thereof.

4. The method of claim 1, wherein the metal silicide layer is conformally deposited over the surfaces of a deep trench formed in the substrate.

5. The method of claim 4, wherein the deep trench has a width between about 50 nm and 100 nm, a depth between about 2000 nm and 5000 nm, and an aspect ratio between about 40:1 and about 100:1.

6. The method of claim 1, wherein the metal precursor comprises a titanium halide, the reducing gas comprises $H_2$, and the metal silicide layer comprises titanium silicide.

7. The method of claim 6, wherein the first and second substrate temperatures are between about 450° C. and about 650° C.

8. A method of forming a metal silicide film on a substrate, comprising:
    a) providing the substrate in a process chamber;
    b) exposing the substrate at a first substrate temperature to a plasma generated from a deposition gas containing a metal precursor, wherein the plasma exposure deposits a conformal metal-containing layer on the substrate in a self-limiting process;
    c) exposing the metal-containing layer at a second substrate temperature to a reducing gas in the absence of a plasma, wherein b) and c) are alternatively performed at least once to form a metal film on the substrate, and wherein the deposition gas does not contain the reducing gas; and
    d) annealing the substrate at a third substrate temperature to form the metal silicide film, wherein the third substrate temperature is greater than the second substrate temperature.

9. The method of claim 8, wherein d) further comprises: depositing silicon on the metal film prior to the annealing.

10. The method of claim 8, wherein the deposition gas comprises a titanium halide, a molybdenum halide, a tungsten halide, a tantalum halide, or a vanadium halide, or a combination of two or more thereof.

11. The method of claim 8, wherein the metal silicide film contains titanium silicide, molybdenum silicide, tungsten silicide, tantalum silicide, or vanadium silicide, or a combination of two or more thereof.

12. The method of claim 8, wherein the metal silicide film is conformally deposited over the surfaces of a deep trench formed in the substrate.

13. The method of claim 12, wherein the deep trench has a width between about 50 nm and 100 nm, a depth between about 2000 nm and 5000 nm, and an aspect ratio between about 40:1 and about 100:1.

14. The method of claim 8, wherein the metal precursor comprises a titanium halide, the reducing gas comprises $H_2$, and the metal silicide layer comprises titanium silicide.

15. The method of claim 14, wherein the first and second substrate temperatures are below about 450° C.

16. A method of forming a metal silicide film on a substrate, comprising:
    a) providing a substrate in a process chamber;
    b) thermally exposing the substrate at a first substrate temperature to a deposition gas containing a metal precursor in the absence of a plasma, wherein the thermal exposure forms a conformal metal-containing layer on the substrate in a self-limiting process;
    c) modifying the metal-containing layer at a second substrate temperature by an exposure to a plasma consisting of only a noble gas; and
    d) exposing the modified metal-containing layer at a second substrate temperature to a reducing gas in the absence of a plasma, wherein the b)-d) are sequentially and alternatively performed at least once to form the metal silicide film.

17. The method of claim 16, wherein the deposition gas comprises a titanium halide, a molybdenum halide, a tungsten halide, a tantalum halide, or a vanadium halide, or a combination of two or more thereof.

18. The method of claim 16, wherein the metal silicide film contains titanium silicide, molybdenum silicide, tungsten silicide, tantalum silicide, or vanadium silicide, or a combination of two or more thereof.

19. The method of claim 16, wherein the metal silicide film is conformally deposited over the surfaces of a deep trench formed in the substrate.

20. The method of claim 16, wherein the deep trench has a width between about 50 nm and 100 nm, a depth between about 2000 nm and 5000 nm, and an aspect ratio between about 40:1 and about 100:1.

21. The method of claim 16, wherein the metal precursor comprises a titanium halide, the reducing gas comprises $H_2$, and the metal silicide layer comprises titanium silicide.

22. The method of claim 21, wherein the first and second substrate temperatures are between about 450° C. and about 650° C.

* * * * *